United States Patent
O et al.

(10) Patent No.: US 7,638,847 B1
(45) Date of Patent: Dec. 29, 2009

(54) ESD PROTECTION STRUCTURE

(75) Inventors: Hugh Sungki O, Fremont, CA (US); Chih-Ching Shih, Pleasanton, CA (US); Cheng-Hsiung Huang, Cupertino, CA (US); Yow-Juang Bill Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 290 days.

(21) Appl. No.: 11/339,907

(22) Filed: Jan. 25, 2006

Related U.S. Application Data

(60) Continuation-in-part of application No. 10/882,874, filed on Jun. 30, 2004, now Pat. No. 7,195,958, which is a division of application No. 10/298,104, filed on Nov. 14, 2002, now Pat. No. 6,777,721.

(51) Int. Cl.
*H01L 23/62* (2006.01)
*H01L 29/72* (2006.01)
*H01L 29/74* (2006.01)
*H01L 31/111* (2006.01)
*H01L 29/73* (2006.01)

(52) U.S. Cl. ............ 257/355; 257/173; 257/174; 257/356; 257/357; 257/358; 257/359; 257/360; 257/361; 257/362; 257/363; 257/E27.001; 257/E29.001

(58) Field of Classification Search ........ 257/173–174, 257/355–363, E27.001, E29.001
See application file for complete search history.

(56) References Cited

U.S. PATENT DOCUMENTS

| | | | | |
|---|---|---|---|---|
| 5,032,742 A * | 7/1991 | Zanders | | 327/546 |
| 5,416,351 A * | 5/1995 | Ito et al. | | 257/357 |
| 5,541,801 A * | 7/1996 | Lee et al. | | 361/56 |
| 5,576,557 A * | 11/1996 | Ker et al. | | 257/173 |
| 6,191,454 B1 * | 2/2001 | Hirata et al. | | 257/360 |
| 6,465,768 B1 * | 10/2002 | Ker et al. | | 250/214.1 |
| 6,548,868 B1 * | 4/2003 | Tsuei et al. | | 257/355 |
| 6,611,028 B2 * | 8/2003 | Cheng et al. | | 257/361 |
| 6,898,062 B2 * | 5/2005 | Russ et al. | | 361/56 |
| 2001/0016380 A1 * | 8/2001 | Watanabe et al. | | 438/237 |
| 2002/0130366 A1 * | 9/2002 | Morishita | | 257/360 |
| 2003/0067040 A1 * | 4/2003 | Chen et al. | | 257/360 |
| 2003/0090845 A1 * | 5/2003 | Ker et al. | | 361/56 |
| 2003/0137789 A1 * | 7/2003 | Walker et al. | | 361/56 |
| 2003/0213995 A1 * | 11/2003 | Duvvury et al. | | 257/355 |
| 2004/0212936 A1 * | 10/2004 | Salling et al. | | 361/56 |
| 2006/0223258 A1 * | 10/2006 | Okushima | | 438/202 |
| 2007/0108527 A1 * | 5/2007 | Lee et al. | | 257/356 |

* cited by examiner

*Primary Examiner*—Ida M Soward
(74) *Attorney, Agent, or Firm*—Ward & Olivo LLP

(57) ABSTRACT

An ESD protection structure includes, in part, a NMOS transistor having a source and drain in a well in a substrate and a gate on the substrate with the source and drain being connected between ground and a series diode, and the gate being connected to ground. The structure further includes a diode having a cathode connected to the input pad and an anode connected to the well so that the diode is reverse-biased in the event of a positive voltage ESD event on the input pad. As a result, in a positive voltage ESD event, the avalanche effect rapidly injects current into the substrate and therefore into the base of the parasitic bipolar transistor so as to trigger the transistor into conduction and discharge the ESD pulse. Alternatively, the diode is a Zener diode and the current is generated by the Zener effect. A complementary structure provides protection against a negative ESD pulse.

12 Claims, 3 Drawing Sheets

ESD PROTECTION STRUCTURE

CROSS-REFERENCE TO RELATED APPLICATIONS

This application is a continuation-in-part of application Ser. No. 10/882,874, filed Jun. 30, 2004 now U.S. Pat. No. 7,195,958 for "Methods of Fabricating ESD Protection Structures," which application is a divisional of application Ser. No. 10/298,104, filed Nov. 14, 2002, now U.S. Pat. No. 6,777,721, for "SCR Device for ESD Protection." The '874 application and the '721 patent are incorporated by reference herein in their entireties.

FIELD OF THE INVENTION

This relates to electrostatic discharge (ESD) protection structures for protecting an integrated circuit from ESD damage.

BACKGROUND OF THE INVENTION

ESD protection has been a main concern in the reliability of integrated circuit (IC) products in submicron complimentary metal-oxide-silicon (CMOS) technologies. For example, gates in N-type metal metal-oxide-silicon (NMOS) and P-type metal-oxide-silicon (PMOS) transistors in input buffers of a CMOS IC are often directly connected to input pads of the IC, causing the CMOS input buffers to be vulnerable to ESD damage. Large ESD devices are used to protect the gates of a CMOS input buffer, but the large ESD devices add significant capacitance to the input pins, and this slows down the input signal propagation. This is not tolerable for high-speed input functions, such as high-speed clock inputs. Therefore, efforts have been made to design ESD protection structures in the input circuitry of an IC that offer sufficient ESD protection while adding as little capacitance to the IC input pins as possible.

Grounded gate NMOS transistors are a frequent choice for an ESD protection circuit. Such a device operates to provide ESD protection by triggering a parasitic lateral bipolar transistor inherent in the MOS structure where the source and drain regions of the MOS transistor constitute the emitter and collector of the lateral bipolar transistor and the substrate constitutes the base. See, for example, A. Amerasekera et al., *ESD in Silicon Integrated Circuits*, pp. 81-95 (2d Ed., Wiley, 2002).

FIG. 1 depicts a cross-section of such a conventional NMOS transistor 10. The transistor comprises a P-type substrate 20, or a P-type well in a substrate, in which are formed first and second N-type lightly doped drain (LDD) regions 30, 35, an N-type source region 40 and an N-type drain region 45. An insulating layer 50 is located on the substrate and a gate 60 is on the insulating layer between the LDD regions. Typically, the gate is used to mask the portion of the substrate underneath the gate during the formation of the LDD regions, the source and the drain. Source region 40 is connected to ground and drain region 45 is connected to an input/output (I/O) pad that is to be protected against ESD.

P-type substrate 20 and N-type source region 40 form a first P-N junction 70 and P-type substrate 20 and N-type drain region 45 form a second P-N junction 75. As a result, a parasitic lateral bipolar transistor 80 is present in transistor 10 having a base-emitter junction that is the first P-N junction 70 and a base-collector junction that is the second P-N junction 75. In the event of a positive voltage ESD event on the input pad, the drain junction is driven into breakdown and avalanche and the parasitic transistor is triggered into conduction to discharge the ESD pulse.

One problem with a grounded-gate NMOS transistor is large capacitance between its drain and ground due to large transistor size. A common practice to reduce the capacitance is to insert some series diodes 212, 214 between an input pad and the drain of an NMOS transistor 10 as shown in FIG. 2. NMOS transistor 10 is the same as transistor 10 of FIG. 1. During the ESD discharge, the ESD current flows through the diodes and causes avalanching in the drain junction 75 of the NMOS transistor. However, since the triggering of the parasitic transistor relies on passing current through the series diodes and the junction breakdown of the NMOS transistor, the triggering tends to be slow and non-uniform and requires relatively high voltages. For example, at 2 Amperes of ESD current, each diode can have a voltage drop of 1.5V. Thus, the trigger voltage is increased by at least 1.5V depending on the number of diodes put in series. High voltages, however, are not desirable with modern MOS transistors because they have extremely thin gate oxides that are vulnerable to rupture. In addition, since the triggering of such a transistor relies on junction breakdown, the triggering tends to be non-uniform over a large structure. This, when combined with the higher trigger voltage introduced by the series diodes, makes ESD protection ineffective.

SUMMARY OF THE INVENTION

The present invention is a novel ESD structure for protecting an integrated circuit from ESD damage. In one embodiment, the structure comprises, in part, a NMOS transistor having a source and drain in a well in a substrate and a gate on the substrate with the drain and source being connected between a series diode and ground, and the gate being connected to ground. The anode and the cathode of the series diode are connected to the input pad and the drain of the NMOS transistor, respectively. The series diode serves to reduce the input capacitance imposed by the large NMOS transistor. The structure further comprises another diode having a cathode connected to the input pad and an anode connected to the well so that the diode is reverse-biased in the event of a positive voltage ESD event on the input pad. The breakdown voltage of this diode is significantly lower than the trigger voltage of the NMOS ESD transistor. As a result, in a positive voltage ESD event, the avalanche effect rapidly injects current into the substrate and therefore into the base of the parasitic lateral bipolar transistor present in the NMOS transistor so as to trigger the transistor into conduction and discharge the ESD pulse. In another embodiment of the invention, the reverse-biased diode receives a p-type implant heavier than that for the p-well. This reduces the breakdown voltage of the diode and hence the triggering voltage for the positive ESD discharges. The triggering diode also provides ESD discharge to the ground through the well/substrate of the NMOS ESD transistor in the event of a negative ESD voltage on the input pin.

BRIEF DESCRIPTION OF THE DRAWINGS

These and other objects, features and advantages of the present invention will be more readily apparent from the following Detailed Description in which.

DETAILED DESCRIPTION

In accordance with the present invention, a diode is connected between the substrate of the MOS transistor and the input pad and is connected so that the diode is reverse-biased in the event of a positive voltage ESD event on the input pad. As a result, in a positive voltage ESD event, the avalanche effect in the diode rapidly injects current into the substrate and therefore into the base of the parasitic lateral bipolar transistor in the MOS transistor so as to trigger the transistor into conduction and discharge the ESD pulse. In the event of a negative voltage ESD event on the input pad, the diode is forward-biased and conducts in the forward direction to discharge the ESD pulse through the well/substrate of the NMOS transistor.

Figure 3:
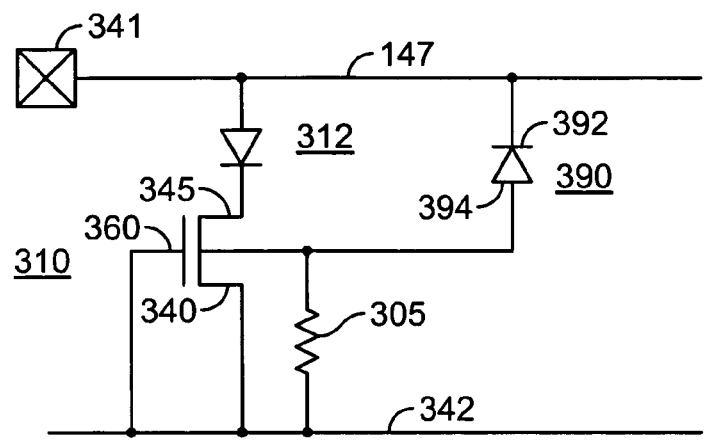
FIG. 3 is a circuit diagram of an illustrative embodiment of the invention.

A circuit schematic of an illustrative embodiment of the invention is set forth in FIG. 3. As shown therein, the circuit comprises an NMOS transistor 310 and a diode 390. NMOS transistor 310 comprises a source 340, a drain 345 and a gate 360. The source and drain are connected between ground 342 and a series diode 312. Gate 360 is connected to ground. Diode 390 comprises a cathode 392 and an anode 394. Cathode 392 is connected to an input pad 341 and anode 394 is connected to the substrate of transistor 310.

In a practical embodiment of the invention, there will also be a low internal resistance in the NMOS transistor 310. In the circuit schematic, this resistance is represented by resistor 305 between the substrate of transistor 310 and ground.

One or more diodes 312 may be connected in series between drain 345 and input pad 341. These diodes, which form no part of the present invention, are used to determine how much of a positive voltage ESD pulse is used to trigger the ESD discharge. Preferably, a single series diode is used to minimize the trigger voltage.

Figure 6:
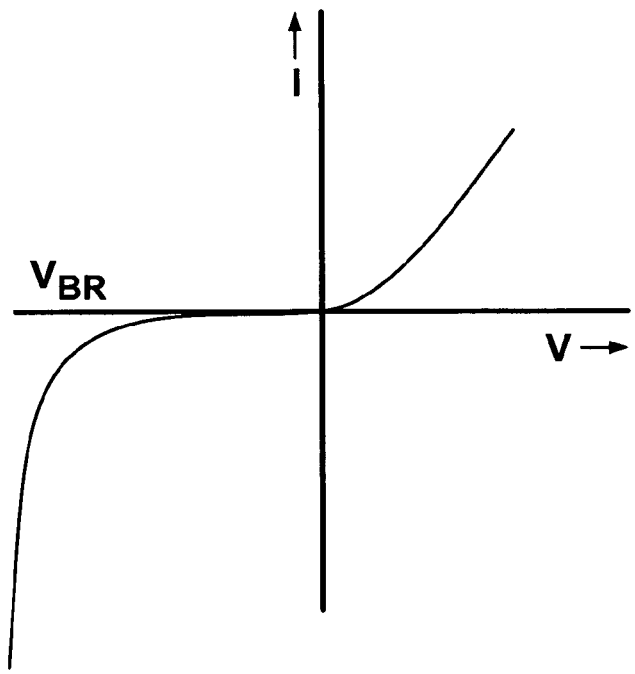
FIG. 6 is plot of the I-V characteristic of a diode.

As will be recognized by those skilled in the art, in the event of a positive voltage on input pad 341, diode 390 will be reverse-biased. If the reverse bias across diode 380 is large enough, diode 390 will breakdown and conduct. FIG. 6 is a plot of the I-V characteristics of a conventional diode. As will be apparent, when the breakdown voltage, $V_{BR}$, of a reverse-biased diode is exceeded, reverse current flow through the diode will rise quite rapidly. In a conventional diode this rapid rise in current is due to the avalanche effect. In an alternative embodiment of the invention, the diode can be a Zener diode, in which case the rapid rise in current is due to the Zener effect. Further details about the avalanche effect and the Zener effect may be found, for example, at G. W. Neudeck, "The PN Junction Diode," pp. 75-80 (2d Ed., Addison-Wesley, 1989).

Figure 1:
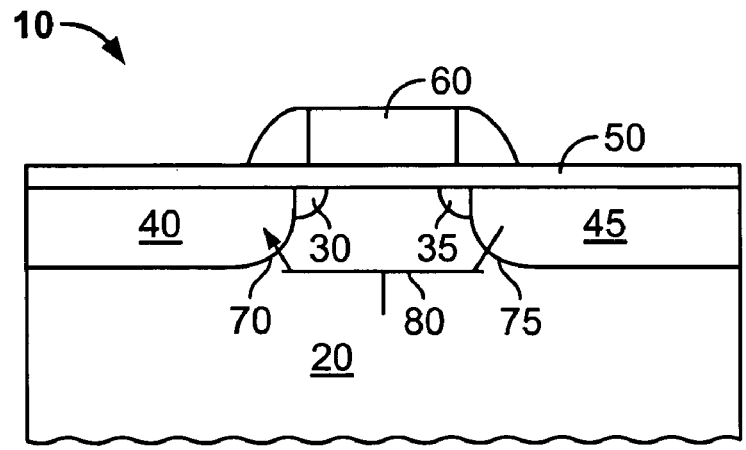
FIG. 1 depicts an NMOS structure used for ESD protection.
Figure 4:
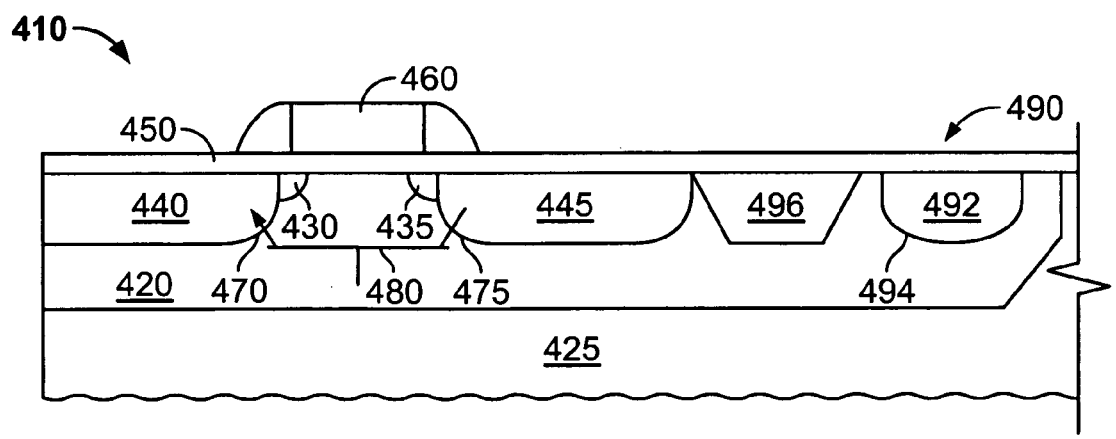
FIG. 4 is a cross-sectional view of a first illustrative embodiment of the invention.

FIG. 4 depicts a cross-section of an NMOS transistor 410 that has been modified in accordance with the invention by connecting the anode of a diode 490 to the substrate. In FIG. 4, elements that are similar to those in FIG. 1 bear the same number incremented by 400. Transistor 410 comprises a P-type well 420 in a substrate 425 in which are formed first and second N-type LDD regions 430, 435, an N-type source region 440 and an N-type drain region 445. An insulating layer 450 is located on the substrate and a gate 460 is on the insulating layer between the LDD regions. A first P-N junction 470 is formed between well 420 and source region 440 and a second P-N junction 475 is formed between well 420 and drain region 445. As a result, a parasitic lateral bipolar transistor 480 is present in transistor 410 having a base-emitter junction that is the first P-N junction 470 and a base-collector junction that is the second P-N junction 475.

An N-type region 492 is formed in a portion of P-type well 420 to form a third P-N junction 494 that constitutes diode 490. N-type region 492 is isolated from transistor 410 by a shallow trench isolation 496. N-type region 492 is connected to an input pad (not shown). As a result, when a positive voltage ESD event is present on the input pad, P-N junction 494 is reverse-biased; and if the voltage is high enough, the junction breaks down and substantial current rapidly flows into substrate 420. The current turns on the parasitic lateral bipolar transistor 480 to discharge the ESD pulse.

The structure of FIG. 4 can be formed as other transistor structures are formed in an integrated circuit. Insulating layer 450 is formed at the same time as other insulating layers. Gate 460 is formed at the same time as other gate structures. The LDD regions 430, 435 are formed in substrate 420 at the same time other LDD regions are formed. N-type regions 440, 445 and 492 are likewise formed at the same time other N-type regions are formed. Likewise, shallow trench isolation 496 is formed at the same time other shallow trench isolation regions are formed.

Figure 5:
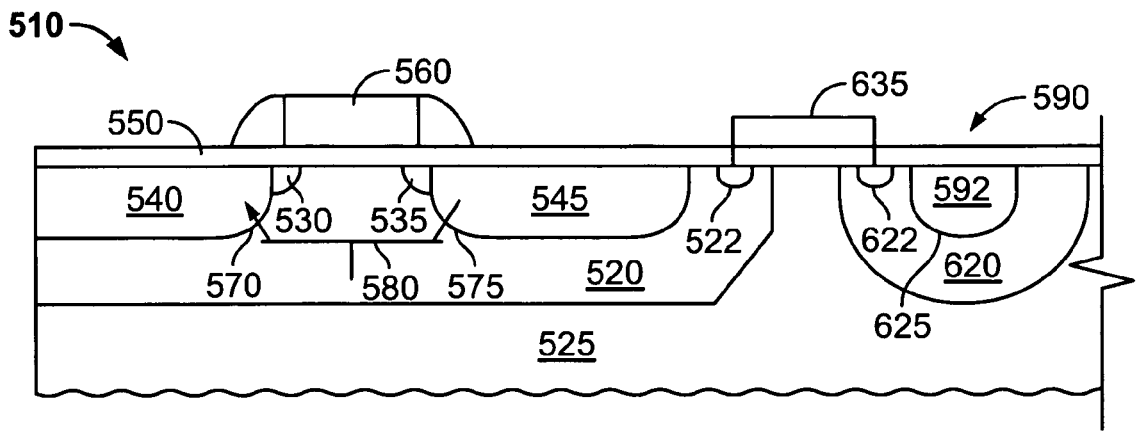
FIG. 5 is a cross-sectional view of a second illustrative embodiment of the invention.

FIG. 5 depicts a cross-section of a second embodiment of an NMOS transistor 510 that has been modified in accordance with the invention by connecting the anode of a diode 590 to the substrate. The structure of this embodiment is similar to that of FIG. 4 except that the diode is formed in a P-type region separate from the P-type well in which the transistor is formed. Accordingly, in FIG. 5 elements that are similar to those in FIG. 4 bear the same number incremented by 100.

Diode 590 comprises an N-type region 592 formed in a P-type region 620 to form a third P-N junction 625 that constitutes diode 590. P-type region 620 is connected to P-type well 520 by a conducting path 635 running between a P+ contact region 522 in P-type well 520 and a P+ contact region 622 in P-type region 620. The conducting path illustratively is formed by a series of vias and metallization layers on the substrate.

Again, the structure of FIG. 5 can be formed as other transistor structures are formed in an integrated circuit. Alternatively, a Zener diode may be formed in place of a conventional diode by making N-type region 592 a highly doped (N+) region and making P-type region 620 a highly doped (P+) region to form the highly doped P-N junction required for a Zener diode. If highly doped N and P regions are formed elsewhere in the integrated circuit, the N+ and P+ regions required for the Zener diode can be formed at the same time. Otherwise, separate deposition steps will be required.

Figure 2:
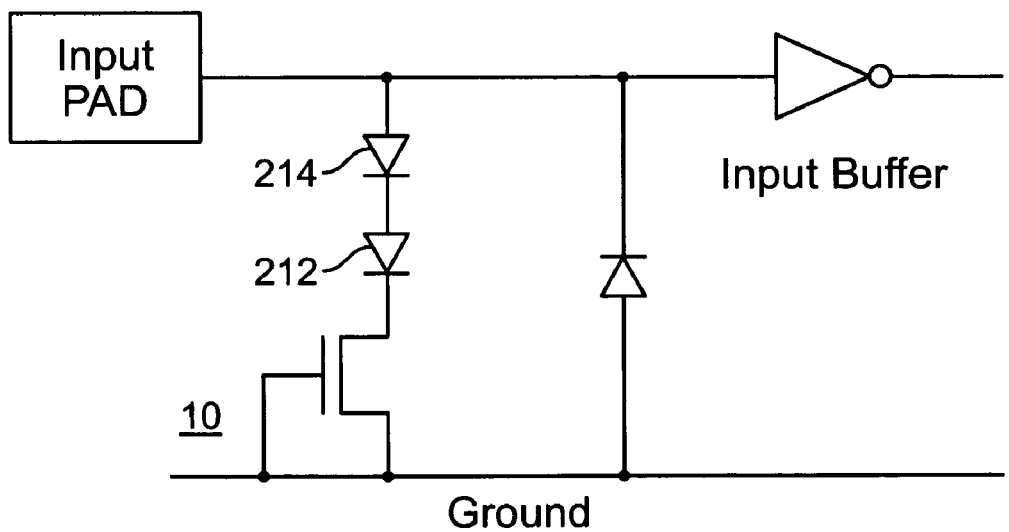
FIG. 2 is a circuit diagram of a prior art ESD protection circuit.

The ESD structure of FIG. 4 has numerous advantages over structures such as that of FIG. 2. By using current injection from the breakdown of diode 490, the trigger voltage can be reduced by more than 1.5 volts at high ESD current. For example, a trigger voltage of 7.5 volts can be realized instead of a trigger voltage of 9 volts in a comparable prior art structure such as that of FIG. 2 that was triggered by junction breakdown of the NMOS transistor. Further reductions in the trigger voltage can be achieved by combining the teaching of the present invention with other known techniques for reducing the trigger voltage. The use of current injection also ensures uniform conduction and makes it possible to reduce the width of the gate of transistor 410 by approximately 50%. In addition to saving valuable space on the integrated circuit, this reduction in gate width also reduces the pin capacitance since the capacitance of transistor 410 is directly proportional to the area of the gate. A reduction in pin capacitance, in turn, makes it possible to increase the speed of input signals on the pins. Similar advantages can be achieved with the ESD structure of FIG. 5.

Circuits are known in which ballasting resistors are connected between the source of prior art transistor 110 and ground and between the drain of transistor 110 and the input pad. The use of such resistors is known to distribute current more evenly thereby avoiding problems arising from excess localized heating. Such ballasting resistors may also be used with the circuit of FIG. 4 by connecting ballasting resistors to source region 440 and drain region 445.

As will be apparent to those skilled in the art, numerous variations may be made within the spirit and scope of the invention. In particular, the concepts of the invention may also be applied to provide further protection to the input pad in the event of a negative ESD pulse. A specific circuit for such protection is the complement of the circuit of FIG. 3 with a PMOS transistor in place of NMOS transistor 310 and a reverse biased P+N diode connected in place of diode 390 with the cathode of the P+N diode connected to the substrate of the PMOS transistor and the anode connected to the input pad.

What is claimed is:

1. An electrostatic discharge (ESD) protection structure comprising;
   a P-type region;
   a first N-type region and a second N-type region formed in said P-type region, said P-type region and said first N-type region forming a first P-N junction and said P-type region and said second N-type region forming a second P-N junction;
   a third N-type region formed in said P-type region and isolated from said first and second N-type regions, said P-type region and said third N-type region forming a third P-N junction;
   an insulating layer on said P-type region;
   a gate on said insulating layer between said first and second N-type regions;
   said first N-type region being connected to an input pad, said second N-type region being connected to ground and said third N-type region being connected to the input pad, whereby a positive voltage ESD event on the input pad causes avalanche breakdown of the third P-N junction resulting in injection of current into the P-type region that turns on a parasitic lateral bipolar transistor formed by the first and second P-N junctions.

2. The ESD protection structure of claim 1 further comprising lightly doped drain (LDD) regions extending from the first and second N-type regions toward each other.

3. The ESD protection circuit of claim 1 wherein the P-type region is a P-well in a substrate.

4. The ESD protection structure of claim 1 further comprising at least one diode connected between the input pad and the first N-type region with an anode of said diode being connected to the input pad.

5. The ESD protection structure of claim 1 wherein the third N-type region is isolated from the first and second N-type regions by a shallow trench isolation.

6. An electrostatic discharge (ESD) protection structure comprising;
   first and second P-type regions in a substrate;
   a first N-type region and a second N-type region formed in said first P-type region, said first P-type region and said first N-type region forming a first P-N junction and said first P-type region and said second N-type region forming a second P-N junction;
   a third N-type region formed in said second P-type region, said second P-type region and said third N-type region forming a third P-N junction;
   an insulating layer on said substrate;
   a gate on said insulating layer between said first and second N-type regions;
   said first N-type region being connected to an input pad, said second N-type region being connected to ground and said third N-type region being connected to the input pad, whereby a positive voltage ESD event on the input pad causes the third P-N junction to inject current into the first P-type region that turns on a parasitic lateral bipolar transistor formed by the first and second P-N junctions.

7. The ESD protection structure of claim 6 further comprising lightly doped drain (LDD) regions extending from the first and second N-type regions toward each other.

8. The ESD protection structure of claim 6 wherein current is injected into the first P-type region as a result of avalanche breakdown of the third P-N junction.

9. The ESD protection structure of claim 6 wherein the first P-type region is a P-well.

10. The ESD protection structure of claim 6 further comprising at least one diode connected between the input pad and the first N-type region with an anode of said diode being connected to the input pad.

11. The ESD protection circuit of claim 6 wherein the third N-type region and the third P-type region are both highly doped to form a Zener diode.

12. The ESD protection circuit of claim 11 wherein current is injected into the first P-type region as a result of Zener effect.

* * * * *

UNITED STATES PATENT AND TRADEMARK OFFICE
CERTIFICATE OF CORRECTION

PATENT NO. : 7,638,847 B1  Page 1 of 1
APPLICATION NO. : 11/339907
DATED : December 29, 2009
INVENTOR(S) : O et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 628 days.

Signed and Sealed this

Ninth Day of November, 2010

David J. Kappos
*Director of the United States Patent and Trademark Office*